United States Patent
Lee et al.

(10) Patent No.: US 9,154,178 B2
(45) Date of Patent: Oct. 6, 2015

(54) DUPLEXER WITH ENHANCED ISOLATION

(75) Inventors: Woo Yong Lee, San Diego, CA (US); Cheng Jung Lee, Santa Clara, CA (US)

(73) Assignee: Tyco Electronics Services GmbH (CH)

( * ) Notice: Subject to any disclaimer, the term of this patent is extended or adjusted under 35 U.S.C. 154(b) by 142 days.

(21) Appl. No.: 13/698,620

(22) PCT Filed: May 16, 2011

(86) PCT No.: PCT/US2011/036677
§ 371 (c)(1), (2), (4) Date: Jan. 23, 2013

(87) PCT Pub. No.: WO2011/146404
PCT Pub. Date: Nov. 24, 2011

(65) Prior Publication Data
US 2013/0114470 A1    May 9, 2013

Related U.S. Application Data

(60) Provisional application No. 61/345,481, filed on May 17, 2010.

(51) Int. Cl.
| | |
|---|---|
| *H04B 7/005* | (2006.01) |
| *H04B 1/48* | (2006.01) |
| *H01P 1/213* | (2006.01) |
| *H03H 7/46* | (2006.01) |
| *H03H 9/70* | (2006.01) |

(Continued)

(52) U.S. Cl.
CPC ............... *H04B 1/48* (2013.01); *H01P 1/2135* (2013.01); *H03H 7/463* (2013.01); *H03H 9/706* (2013.01); *H03H 9/725* (2013.01); *H04B 1/525* (2013.01)

(58) Field of Classification Search
CPC ........ H04B 1/48; H04B 1/0057; H04B 1/525; H03H 9/725; H03H 9/706; H03H 7/463; H01P 1/2135; H04L 25/0286; H04L 27/368
See application file for complete search history.

(56) References Cited

U.S. PATENT DOCUMENTS

| | | |
|---|---|---|
| 2003/0174763 A1 | 9/2003 | Kouki |
| 2005/0073375 A1 | 4/2005 | Sul et al. |
| 2005/0174192 A1 | 8/2005 | Kawamura |

(Continued)

FOREIGN PATENT DOCUMENTS

| | | |
|---|---|---|
| DE | 2121385 A1 | 11/1972 |
| EP | 0441500 A2 | 8/1991 |

(Continued)

OTHER PUBLICATIONS

International Application Serial No. PCT/US2011/036677, International Search Report mailed Aug. 19, 2011, 5 pgs.

(Continued)

*Primary Examiner* — David Oveissi

(57) ABSTRACT

A system includes a transmit filter (160) in a transmit path to couple to an antenna (120) and pass signals in a transmit band. A receive filter (155) is disposed in a receive path to couple to the antenna and to the transmit filter to pass signals in a receive band different from the transmit band. An enhanced frequency variable impedance (145) is used to provide isolation between signals in the transmit and receive bands on the receive path. A phase and magnitude controlled feedback path can also be used to cancel transmit signals in the receive path.

19 Claims, 11 Drawing Sheets

(51) Int. Cl.
*H03H 9/72* (2006.01)
*H04B 1/525* (2015.01)

(56) References Cited

U.S. PATENT DOCUMENTS

| | | |
|---|---|---|
| 2007/0015468 A1 | 1/2007 | Kouki et al. |
| 2009/0025043 A1* | 1/2009 | Song et al. ............... 725/85 |
| 2010/0157858 A1* | 6/2010 | Lee et al. ............... 370/297 |
| 2011/0090023 A1* | 4/2011 | Itoh et al. ............... 333/109 |

FOREIGN PATENT DOCUMENTS

| | | |
|---|---|---|
| EP | 1653615 A1 | 5/2006 |
| WO | WO-2011146404 A1 | 11/2011 |

OTHER PUBLICATIONS

International Application Serial No. PCT/US2011/036677, Written Opinion mailed Aug. 19, 2011, 10 pgs.
"Chinese Application Serial No. 201180035204.3, Voluntary Amendment filed Sep. 5, 2013", (W/ English Translation), 8 pgs.

\* cited by examiner

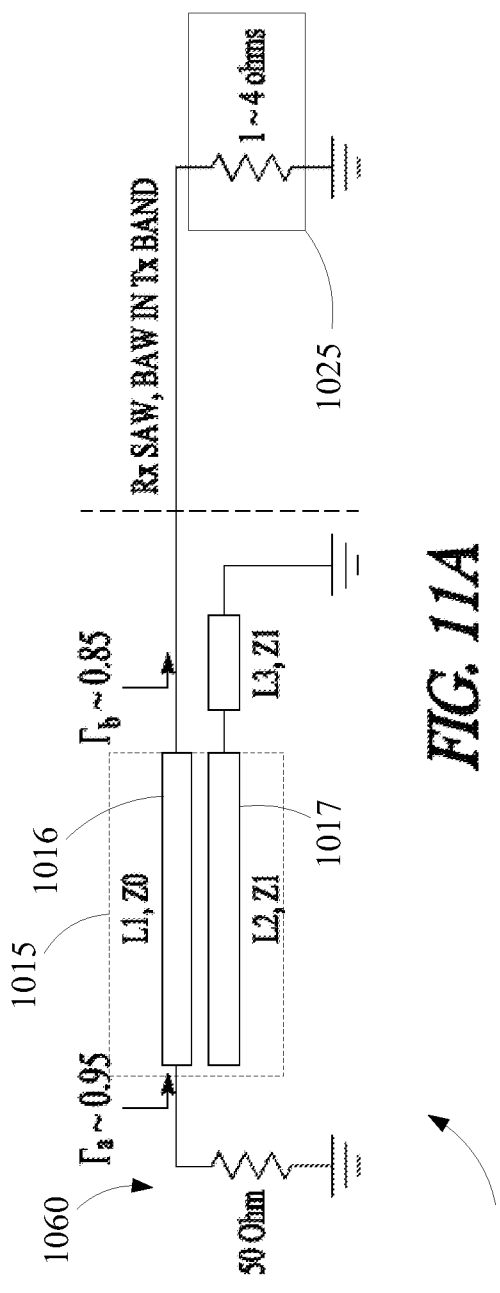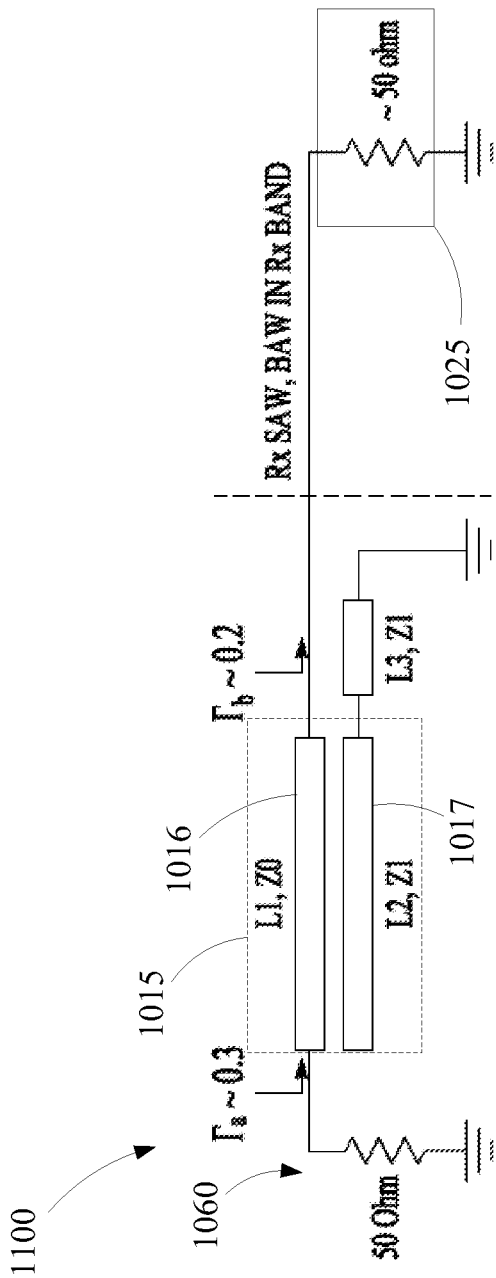

US 9,154,178 B2

DUPLEXER WITH ENHANCED ISOLATION

CLAIM OF PRIORITY

This application is a U.S. National Stage Application under 35 U.S.C. 371 from International Application No. PCT/US2011/036677, entitled "Duplexer with Enhanced Isolation," filed May 16, 2011, which claims the benefit of priority to U.S. Provisional Patent Application Ser. No. 61/345,481, entitled "Duplexer with Enhanced Isolation," filed on May 17, 2010, the benefit of priority of each of which is hereby presently claimed, and each of which is hereby incorporated by reference herein in its respective entirety.

BACKGROUND

Communication devices have a basic set of functions that are performed to send, receive and process information. As these functions may include components, hardware, software, or a combination, there is a desire to optimize use of components and thus reduce the number of components used in a given design. In a wireless communication device, an antenna may be used for both transmission of Radio Frequency (RF) signals and receipt of RF signals. A duplexer may be used to facilitate this use of an antenna. A duplexer allows bi-directional or duplex communication over a single channel. The duplexer effectively isolates the receiver portion of the communication device from the transmitter portion, allowing sharing of the antenna.

OVERVIEW

A duplexer may be designed to operate in the frequency band of the transmitter as a BPF (Band Pass Filter) as well as in the frequency band of the receiver as a BPF. The duplexer may be designed to provide the requisite output power of the transmitter. Ideally, the duplexer provides 1) rejection of transmitter noise occurring at the receive frequencies at the transmit BPF and 2) rejection of transmitter leakage power occurring at the transmit frequencies at the receive BPF. The performance of the duplexer is generally a function of the isolation it provides, which is related to the frequency separation, referred to as a duplexing guard band, between the transmit and receive frequencies.

When a device reuses an RF component for transmit and receive signals, the duplexer and the configuration of the device circuitry may produce undesirable effects, such as unwanted signals or noise. For example, the components specific to the receive path, Rx path, are typically less robust than those for the transmit path, Tx path, as the transmit voltages (or powers) are generally higher for the Tx path. When transmit voltages (or powers) at transmit frequencies leak at the receive RFIC input, the RF receiver may experience voltages (or powers) above the capability of the Rx path. The receiver may become desensitized and unable to properly process received signals, such as where the coupling during processing of signals at transmit level voltages may result in Inter-modulation Distortion (IMD) Products in components on the Rx path which may not be designed to operate at the enough high level voltages (or powers). The Rx path components may be susceptible to such voltages (or powers) include a Low Noise Amplifier (LNA) followed by a Demodulator (or Mixer) on the Rx path.

To avoid these effects, duplexer design generally incorporates isolation mechanisms, such as including the use of Surface Acoustic Wave (SAW) filters or Bulk Acoustic Wave (BAW) filters that act to remove (e.g., suppress or reject) unwanted signals from the Rx path. Implementation of isolation mechanisms, however, adds to the overhead in design, layout and cost of manufacture of a device.

An example, such as comprising a system, can include a transmit filter in a Tx path to couple to an antenna and pass signals in a transmit band. A receive filter is disposed in an Rx path to couple to the antenna and to the transmit filter to pass signals in a receive band different from the transmit band. A frequency variable impedance is used to improve isolation between paths in the transmit and receive bands on the Rx path. In some embodiments, a phase and magnitude controlled feedback path can also be used to cancel transmit signals in the Rx path.

BRIEF DESCRIPTION OF THE DRAWINGS

FIGS. 11A and 11B include illustrative examples of coupler performance for transmit and receive bands, respectively.

Figure 1:
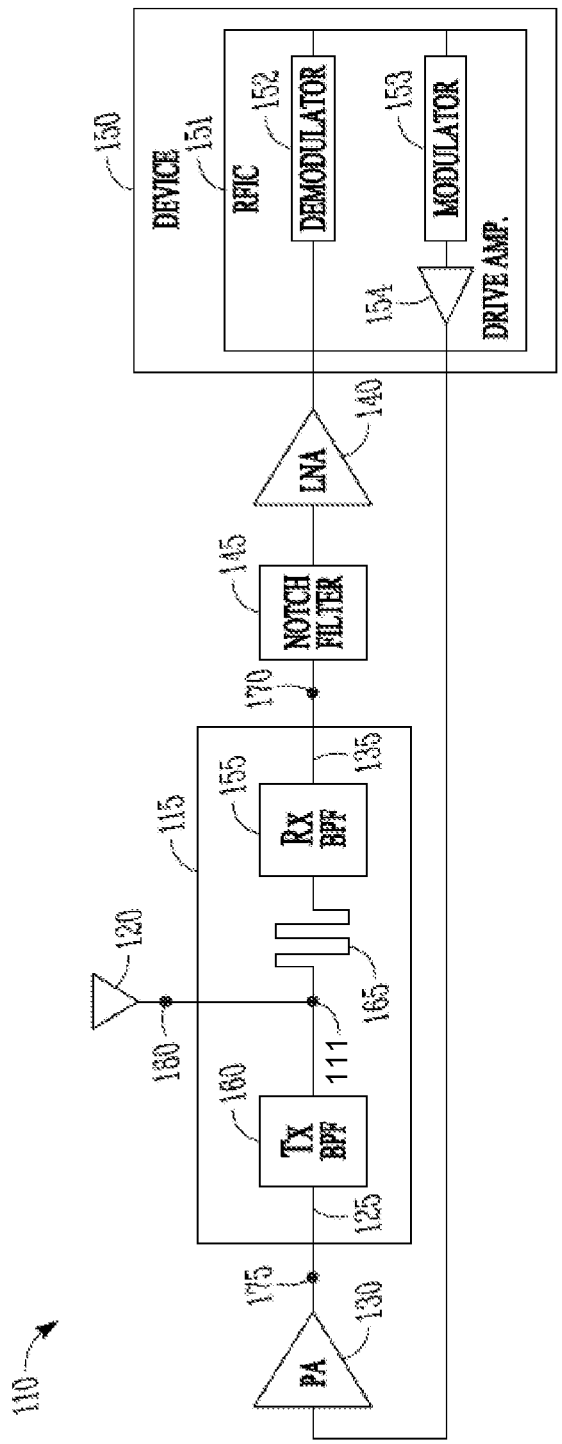
FIG. 1 illustrates generally a block diagram of a system that can include a duplexer for separating receive and transmit signals for a communication device according to an example.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In a communication device employing a duplexer, signals are transmitted on frequencies within a transmit (Tx) frequency band and signals are received on frequencies within a receive (Rx) frequency band. The Rx path and the Tx path are both coupled to the duplexer, which provides Tx signals to the Tx path and Rx signals to the Rx path.

In an embodiment, a notch filter is added in the Rx path to notch out transmit leakages. The notch filter is generally effective until transmit and receive frequencies move close enough to each other to be within a specified frequency gap. In a second embodiment, two couplers are added, one in the Tx path and the other in the Rx path. A phase shift and magnitude control is used to cancel out (e.g., reduce or suppress) transmit signals obtained from the Tx path by applying the phase shifted signal to the Rx path via the Rx path coupler. The effectiveness of the cancellation is dependent on the accuracy of the phase shift and magnitude control. The couplers may be placed at many different pairs of points in the Tx and Rx paths.

In an embodiment, a coupler is placed between a receive bandpass filter and the Tx path. The coupler is designed to have a high reflection coefficient to Tx path signals so as to present an open circuit to transmit signals while allowing Rx path signals to pass.

FIG. 1 illustrates a system shown generally at 110 that includes a duplexer 115 coupled to an antenna 120. Duplexer 115 includes a Tx path 125 for coupling to a power amplifier 130. Duplexer 115 system also includes a Rx path 135 for coupling to a low noise amplifier (LNA) 140 followed by a RFIC (Radio Frequency Integrated Circuit) 151. The RFIC 151 is coupled to both the power amplifier 130 for providing signals to be transmitted and the LNA 140 for processing received signals. RFIC 151 can be a part of cell phone or other type of RF wireless device 150, and can also include a Modulator 153, a Demodulator 152. In an embodiment, a Drive Amp 154 can be included such as for handling multiple transmit and receive channels.

Duplexer 115 includes a receive band pass filter (Rx BPF) 155 in the Rx path 135, and a transmit band pass filter (Tx BPF) 160 in the Tx path. A node Tx port 175 identifies the input to the duplexer 115 on the Tx path 125, and a node Rx port 170 identifies the output of duplexer 115 on the Rx path 135. The Tx path 125 and the Rx path 135 have a common node 111 that couples to antenna 120. Both transmit signals on the Tx path and receive signals on the Rx path can use antenna 120, and such signals are generally propagated on their respective Tx and Rx paths in duplexer 115 as allowed by the band pass filters.

Antenna 120 is coupled to the Rx path 135 such as via a quarter wave transformer 165, which is positioned between antenna 120 and Rx BPF 155, and provides an open circuit to the receiver BPF at the node 154 where the output of Tx BPF 160 and an antenna port 180 are coupled.

Antenna 120 is coupled to the Rx path 135 such as via a quarter wave transformer 165, which is positioned between antenna 120 and Rx BPF 155, and provides an open circuit to the receiver BPF at the node 111 where the output of Tx BPF 160 and an antenna port 180 are coupled. Antenna 120 is also coupled to the Tx path via the Tx BPF 160. Between the duplexer 115 and the LNA 140 is a notch filter 145.

Figure 2:
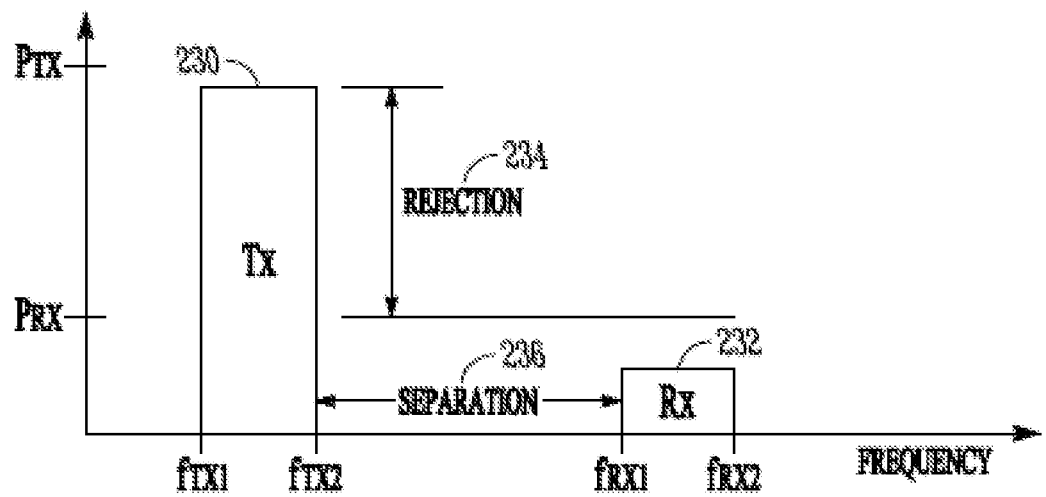
FIG. 2 illustrates generally a power spectrum for the duplexer of FIG. 1, for transmission of signals and receipt of signals according to an example.

FIG. 2 illustrates generally an illustrative example including a plot of a power spectrum of Tx and Rx bands 230 and 232. The Tx frequency band 230 includes frequencies from $f_{Tx1}$ to $f_{Tx2}$, and the Rx frequency band 232 includes frequencies from $f_{Rx1}$ to $f_{Rx2}$. There is a separation 236 between the Tx frequency band 230 and the Rx frequency band 232. The Tx frequency band has an associated power level, $P_{Tx}$, and the Rx frequency band has an associated power level, $P_{Rx}$. The power level $P_{Tx}$ is significantly greater than the power level $P_{Tx}$.

In system 110, the duplexer 115 is adapted to operate according to the frequency band of the signals received or transmitted. Transmit signals are provided to the duplexer 115 from the RFIC 150 and are amplified by the power amplifier 130. The Tx signal is then received at the duplexer 115 for over the air transmission by antenna 120. The transmit path 125, or Tx path, includes Driver Amp 154 and Modulator 153 in the RFIC 151, power amplifier 130, duplexer 115 and antenna 120. The antenna 120 transmits Tx signals at frequencies within the Tx frequency band 230 illustrated in FIG. 2. The antenna 120 receives Rx signals within the Rx frequency band 232 and passes the Rx signals to duplexer 115. The Rx signals are processed by duplexer 115 which passes the Rx signals to LNA 140 and to Demodulator 152 in the RFIC 151 for further processing. The Rx signals are received at frequencies within the Rx frequency band, also illustrated in FIG. 2.

Transmission of Tx signals results in some leakage of the Tx signals on the Rx path 135. The Tx signals are transmitted at the higher power associated with the Tx frequency band, such as identified by $P_{Tx}$ in the example of FIG. 2. This higher power results in a need of a high attenuation of the Tx signals when received on the Rx path 135, else the Tx signal may saturate or otherwise desensitize the RFIC 151. The attenuation can be referred to as part of the insertion loss. The amount of rejection in the Rx path 135 is related to the difference of insertion losses between the Rx frequency band and the Tx frequency band in Rx BPF. It is desirable to isolate the Tx path 125 and the Rx path 135. Such isolation is referred to herein as Tx-Rx isolation and contributes to improve the Signal-to-Noise Ratio (SNR) of the received signals.

In an embodiment, a frequency-variable impedance, such as a notch filter 145 is included in the Rx path 135. It can be included within the duplexer 115, or external to it as shown between duplexer 115 and LNA 140 in FIG. 1. As illustrated in FIG. 2, isolation of the Tx frequency band 230 in Rx path 135 includes a rejection 234. In an embodiment, the notch filter 145 can be used to improve the Tx-Rx isolation and improve performance of communication device 150. In various embodiments, the elements of FIG. 1 can be formed as separate integrated circuits, or combined into one or more integrated circuits.

The behavior of the duplexer 115 can be illustrated by a plot of insertion loss in decibels (dB) as a function of frequency for each of the operating conditions of an example duplexer. The insertion loss provides a measure of path losses which occur due to the structure of the duplexer. The insertion loss can be defined as:

$$\text{Insertion Loss(dB)} = 10 \log(P\text{out}/P\text{in}) \qquad (1)$$

or as:

$$\text{Insertion Loss(dB)} = 20 \log(V\text{out}/V\text{in}) \qquad (2)$$

where Pout and Pin can represent measurements (or simulated estimates) of power taken at an output port and an input port of a device, respectively. Similarly, Vout and Vin can represent measurements (or simulated estimates) of voltage taken at an output port and an input port of a device, respectively.

As the duplexer 115 is housed in a package, there are a variety of leakage paths. The package houses a receiver portion, having a Rx port 170 coupled to Rx BPF 155, and a transmitter portion, having a Tx port 175 coupled to the Tx BPF 160.

Operation of the duplexer 115 has symmetry between a Tx port 175 and an antenna port 180. This means that the plot of insertion loss also explains how signals received at the antenna can be experienced at the Tx port 175. For example, when a signal of amplitude A is received at antenna port 180 in the Rx frequency band, such as Rx frequency band 232 of FIG. 2, the signal is attenuated at the Tx port 175 according to the corresponding insertion loss value. For example, if a signal is received at amplitude A at a frequency of 2100 MHz at the antenna port 180, that signal is attenuated according to the insertion loss seen at the Tx port 175.

The duplexer has a similar symmetry between the antenna and the Rx port 170. This symmetry can be used to understand the behavior of the duplexer in a variety of scenarios. For example, behavior of Tx frequencies at the Rx port provides information as to the effect during the Tx mode on the receiver portion of the duplexer.

The duplexer is designed to pass signals in the Rx frequency band through the Rx filter and reject other frequencies. Therefore, the insertion loss is expected to be very low for the pass frequencies, e.g., within the Rx frequency band. For frequencies outside the Rx frequency band the insertion loss is higher. The receiver portion such as receive part of RFIC is generally designed for a much lower power sensitivity and can be saturated and the receive signals can be distorted by excessive power levels and fluctuations. The Tx path need not be symmetric nor must the Rx path be symmetric with respect to insertion loss.

In system 110, various leakage paths contribute to interactions between the Tx and Rx paths, sometimes causing unwanted or unacceptable behavior. In an embodiment, the notch filter 145 is placed external to the duplexer 115 to filter out Tx leakage on the Rx path prior to the LNA or other hardware. A first type of electromagnetic leakage occurs through the Rx BPF 155. A second leakage can occur through the packaging and substrate of the duplexer 115. A third leakage can occur through a printed circuit board (PCB) and ground of the communication device 150.

In an embodiment, notch filter 145 can be used to notch out or filter out frequencies which include the three types of leakage discussed with respect to duplexer 115. In some embodiments, the notch filter 145 can reject Rx frequencies while filtering out Tx frequencies. In an embodiment, the notch filter 145 is positioned at the Rx port 170 and acts to filter out signals of the Tx frequency, and thus prevent unwanted, strong Tx leakage signals to LNA 140 and demodulator 152. Notch filter performance improves with the high Q factor (quality factor) of the device technology and design technique applied for the filter implementation.

Figure 3:
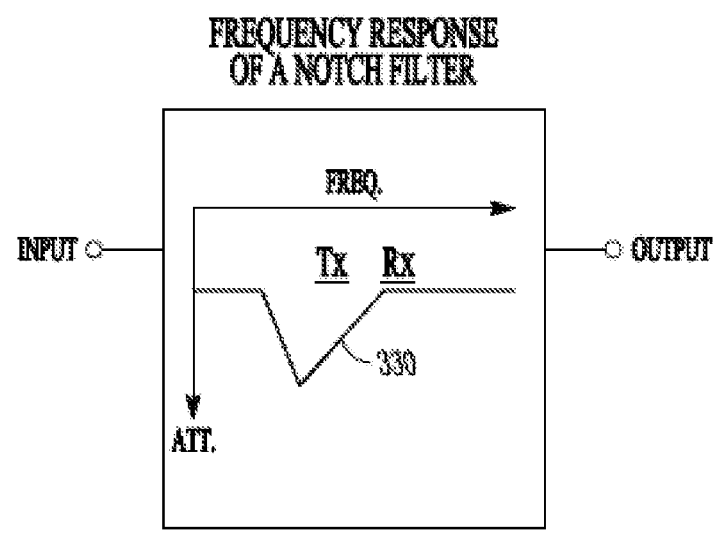
FIG. 3 illustrates generally a notch filter frequency response according to an example.

FIG. 3 illustrates generally an illustrative example of a frequency response of a notch filter in conjunction with transmit band and receive band. As illustrated, the attenuation of the received signal is plotted as a function of frequency. The resultant response 330 illustrates reduced attenuation for Tx frequencies with respect to Rx frequencies.

Figure 4A:
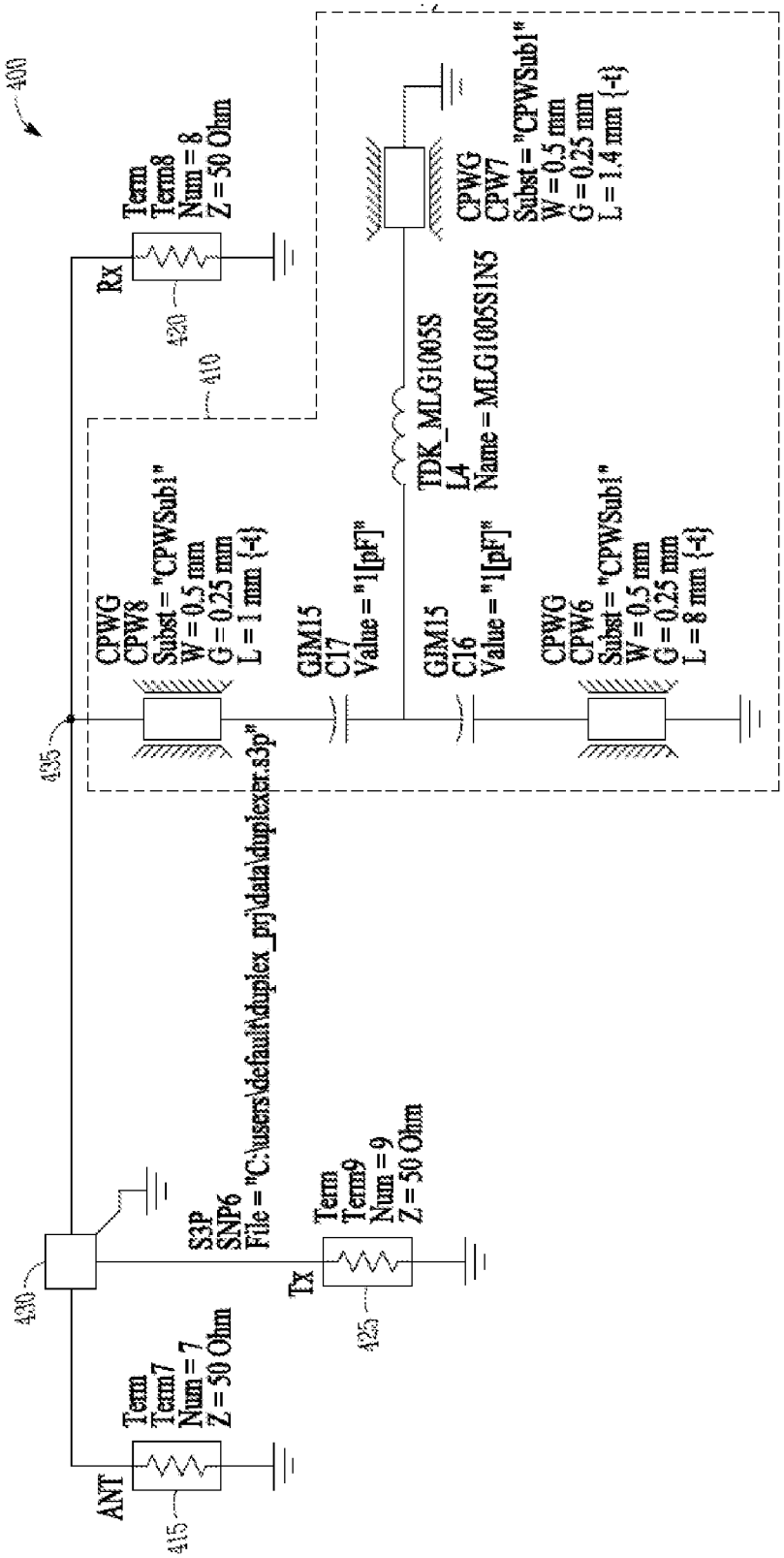
FIG. 4A illustrates generally a block schematic view of a system that can include a notch filter and duplexer, according to an example.

FIG. 4A illustrates generally a block schematic view of a system 400 which includes an example notch structure 410 identified by the dashed line. This notch structure 410 can be used directly as a notch filter or can be coupled with certain lengths of transmission lines before and after the input and output of the notch filter core, such as depending on the application. An antenna is represented by an impedance 415. A Rx path is represented by an impedance 420 with a Tx path illustrated by impedance 425. A package for a duplexer 430 is coupled to the antenna 415 and the Tx port 425, as well as to the notch structure 410 and the Rx port 420. The duplexer 430 is illustrated as coupled to ground. The impedances are illustrated as 50 Ohms on each of the Rx and Tx ports according to some embodiments, wherein a variety of other configurations can be used to implement system 400.

The notch structure 410 in an embodiment comprises two series capacitors, one shunt inductor and two shorted CPW stubs in a configuration as illustrated. Other embodiments can implement alternate configurations and elements for the notch structure 410. The notch structure 410 is connected to the node 435 between the Rx path 420 and the receiving output of duplexer 430 through a short CPW line (CPW8). This notch filter will stop the signal transmission from the output of the duplexer 430 which is coupled to the Rx port 420 for signals in the Tx frequency band. In the Rx frequency band, the notch structure 410, or other notch filter, represents high impedance and has minimum effect to the signal transmission between the output of the duplexer 430 and the receiving path 420.

Figure 4B:
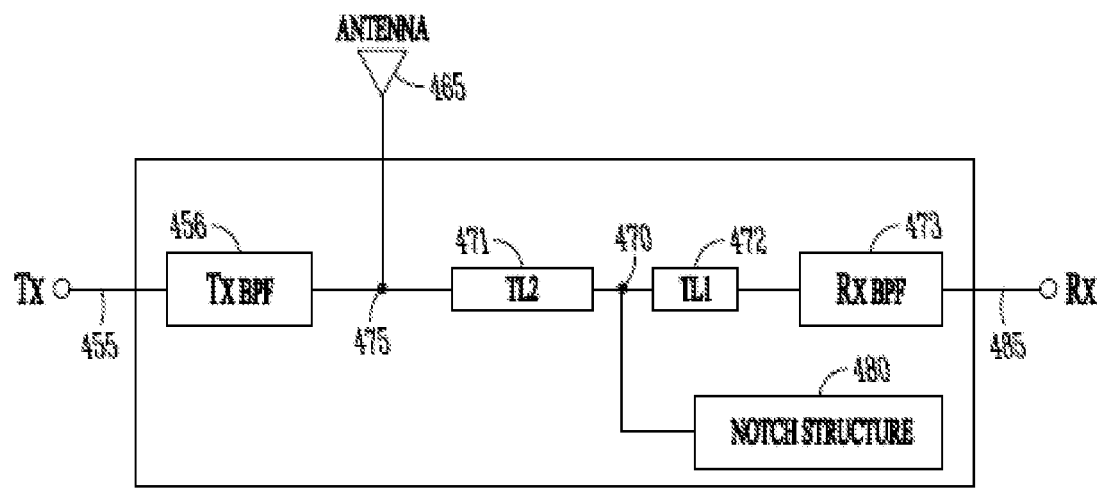
FIG. 4B illustrates generally a block schematic view of a system including a notch filter between a node and a receive bandpass filter, according to an example.

In the embodiment of FIG. 4B, a notch filter is inserted between the node 475 and one end of the RX BPF 473 to improve the Tx/Rx isolation between Tx port 455 and Rx port 485. The notch filter comprises a notch structure 480, transmission line TL1 472 and transmission line TL2 471. The Tx BPF 456 and transmission line TL2 471 are both coupled to the node 475 and thus to antenna 465. The notch structure 480 is coupled to the node 470. One end of TL1 472 is coupled to the node 470 and the other end is coupled to the Rx BPF 473. One end of TL2 471 is coupled to the node 470 and the other end is coupled to the node 475. In the receive frequency band, the notch filter can presents a specified impedance value, such as a 50 Ohm impedance, such that the signals can propagate from antenna to the Rx port 485 with minimum insertion loss. In the transmit frequency band, the Rx BPF 473 along with TL1 472 present an impedance far from 50 Ohms at the node 470. Optimizing the notch structure 480 and TL1 472 at the same time provides the signal rejection function to improve the isolation between Tx port 455 and Rx port 485. In addition, the TL2 471 will transform the impedance seen at node 470 to substantially open circuit at node 475 to route Tx signal to antenna port 465.

Figure 5:
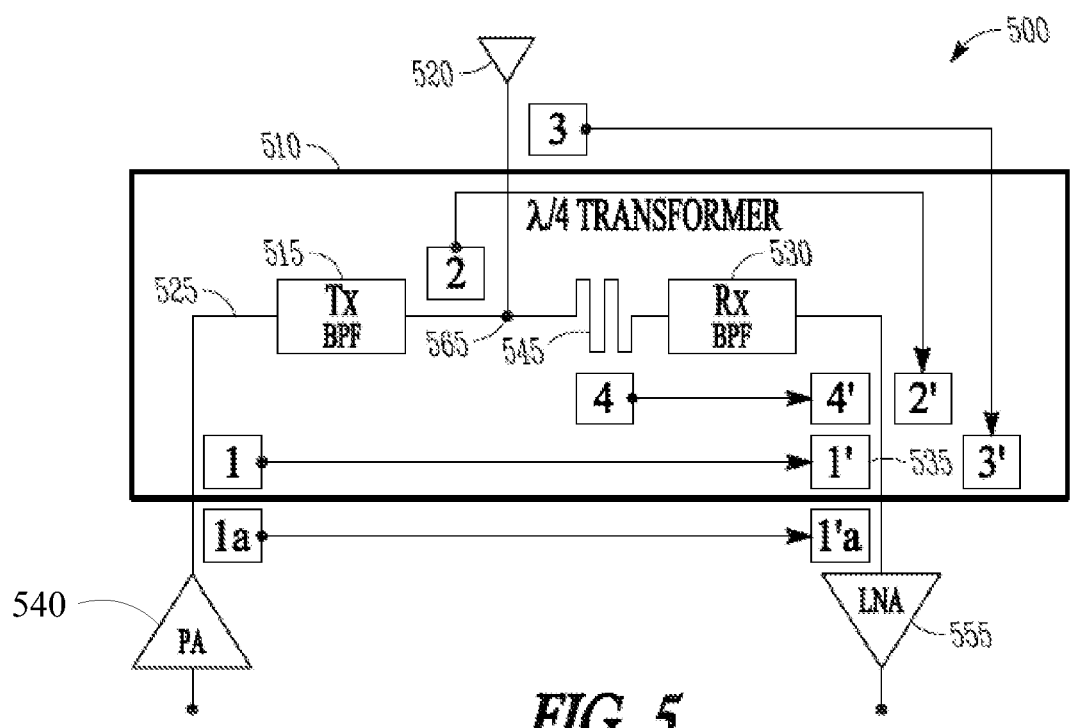
FIG. 5 illustrates generally a block diagram of a duplexer illustrating various transmit signal cancellation feedback paths according to an example.

One system for reducing leakage factors is shown at 500 in FIG. 5 and involves the use of a tapping device and a corresponding cancellation device. System 500 includes a duplexer 510 with a Tx BPF 515 to couple to an antenna 520 and pass signals along Tx path 525 from a PA to antenna 520. A Rx BPF 530 can also be coupled to antenna 520 and to the quarter wave transmission line 545 to pass signals in a receive frequency band as received at antenna 520, and wherein the receive frequency band is different from the transmit frequency band, and send the received signals along a Rx path 535. A quarter wave transformer 545 can be coupled between the node 565 and the receive bandpass filter 530 in the Rx path 535. The quarter wave transformer 545 in an embodiment is tuned to the transmit frequency band.

A pair of couplers can be used to form a proper coupling path and simultaneously a proper phase shift path. The signals at the Tx frequency band can travel from Tx path 525 to Rx path 535 through two paths. One path is to go through the leakage path from the Tx BPF 515 to the Rx BPF 530, while the other path is to go through the coupling path identified from point 1 (coupler) to point 1' (coupler), identified as "path 1-1'," for example. The pair of couplers (1 and 1') are respectively inserted or "tapped" into the Tx path 525 and the Rx path 535 to provide an approximately 180 degree phase difference between the two paths of transmit signals in the Rx path 535 where the two path signals are coupled again and canceled each other at the receive coupler. The coupling magnitude of the transmit signal between the tapping points through the coupling path 1-1' is set to be the same as the attenuation between the path through the leakage path from Tx BPF 515 to Rx BPF 530. Several alternative pairs of couplers are illustrated in FIG. 5 as blocks with numbers identifying each pair, and includes: (1-1'), (1a-1a'), (2-2'), (3-3'), and (4-4'). The first number in each pair corresponds to a tap in the Tx path 525. The corresponding primed number of each pair corresponds to a tap in the Rx path 535 that is used to provide a phase shifted signal to cancel the signal in the Rx path that corresponds to the introduced leakage. System 500 can provide at least −70 dB isolation over interested frequency bands.

Coupler pair (1a-1'a), corresponds to tapping devices placed outside of duplexer 510. Tapping device 1a is positioned between duplexer 510 Tx path and a power amplifier 550 along the Tx path 525.

Coupler pair (1a-1'a), corresponds to tapping devices placed outside of duplexer 510. Tapping device 1a is positioned between duplexer 510 Tx path and a power amplifier 550 along the Tx path 525. Corresponding tapping device 1'a is coupled between duplexer 510 Rx bath and a low noise amplifier 555 along Rx path 535. Tapping device pair 1-1', are each coupled in respective paths just inside the duplexer 510. Tapping device 2 is coupled between the antenna 520 and Tx band pass filter 515, with corresponding tapping device 2' positioned in the Rx path 535 within duplexer 510. Tapping device 3 is coupled proximate an antenna connection port, which can be external to duplexer 510, and having a corresponding tapping device 3' positioned in the Rx path 535 within duplexer 510. Tapping device 4 is positioned to tap into signals in the quarter wavelength transformer 545, with corresponding tapping device 4' positioned in the Rx path 535 within duplexer 510. Each of these pair combinations is to compensate for leakage currents, and each can have a different impact on operation of the duplexer 510. Various combinations are considered and others can be implemented according to the design and application of a duplexer.

Figure 6:
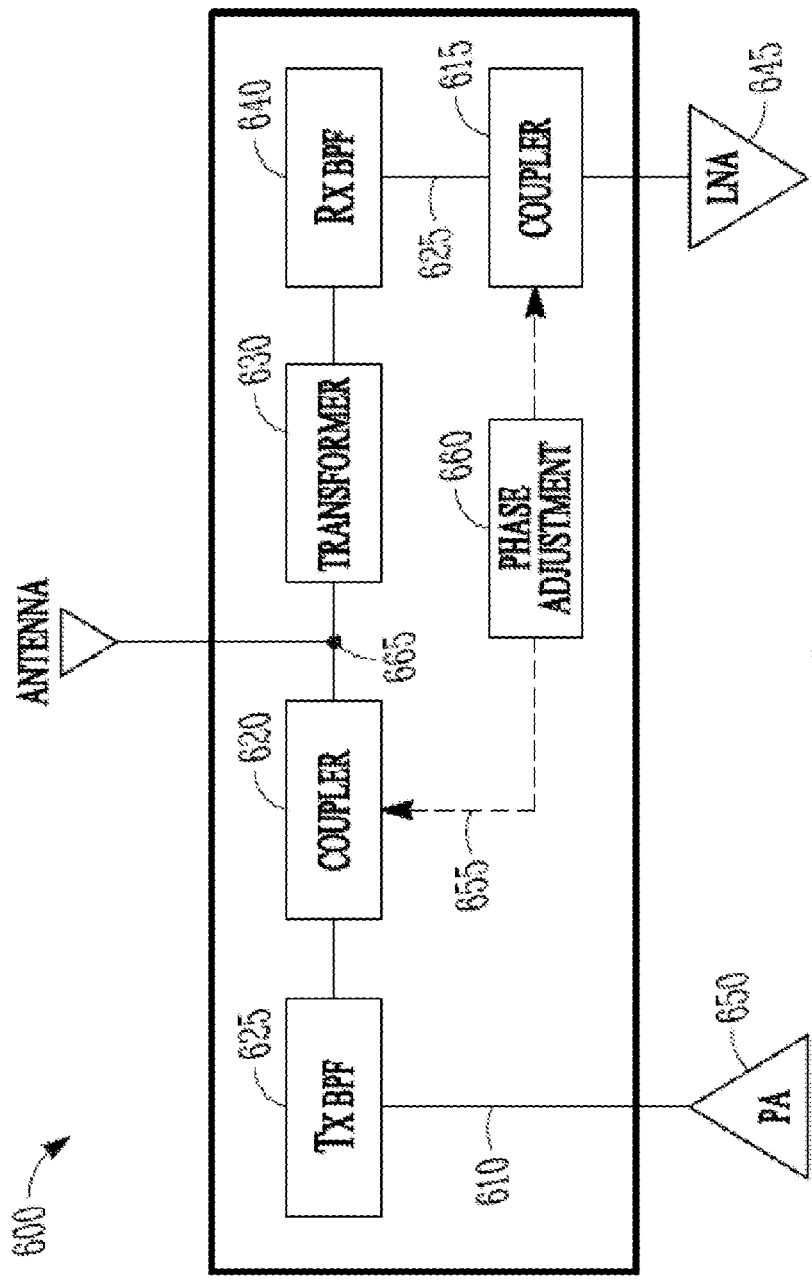
FIG. 6 illustrates generally a block representation illustrating detail of one coupler pair in a feedback path according to an example.

FIG. 6 illustrates generally a block representation illustrating detail of one coupler pair consisting of tapping devices 620, 615 corresponding to the tapping devices 2-2' in FIG. 5. In an embodiment, tapping device 620 is inserted in a Tx path 610 between a Tx BPF 625 and a transformer 630. The corresponding coupler 615 is inserted in a Rx path 625 between a Rx BPF 640 and an LNA 645. The Rx BPF 640 is also coupled to the transformer 630 in the Rx path 625. The Tx BPF 625 is also coupled to a PA 650.

Each coupler of the coupler pair is coupled to each other as represented by broken line 655, which includes a phase adjuster 660 to provide the approximately 180 degree phase difference between leakage path and coupling path, and the coupling factors of the tapping devices 620, 615 provide a corresponding magnitude control to effectively cancel signals leaking from the Tx path 610 into the Rx path 625. In some embodiments, the couplers/taps can be formed to behave as a metamaterial. In other embodiments, standard couplers/taps can be used.

Figure 7:
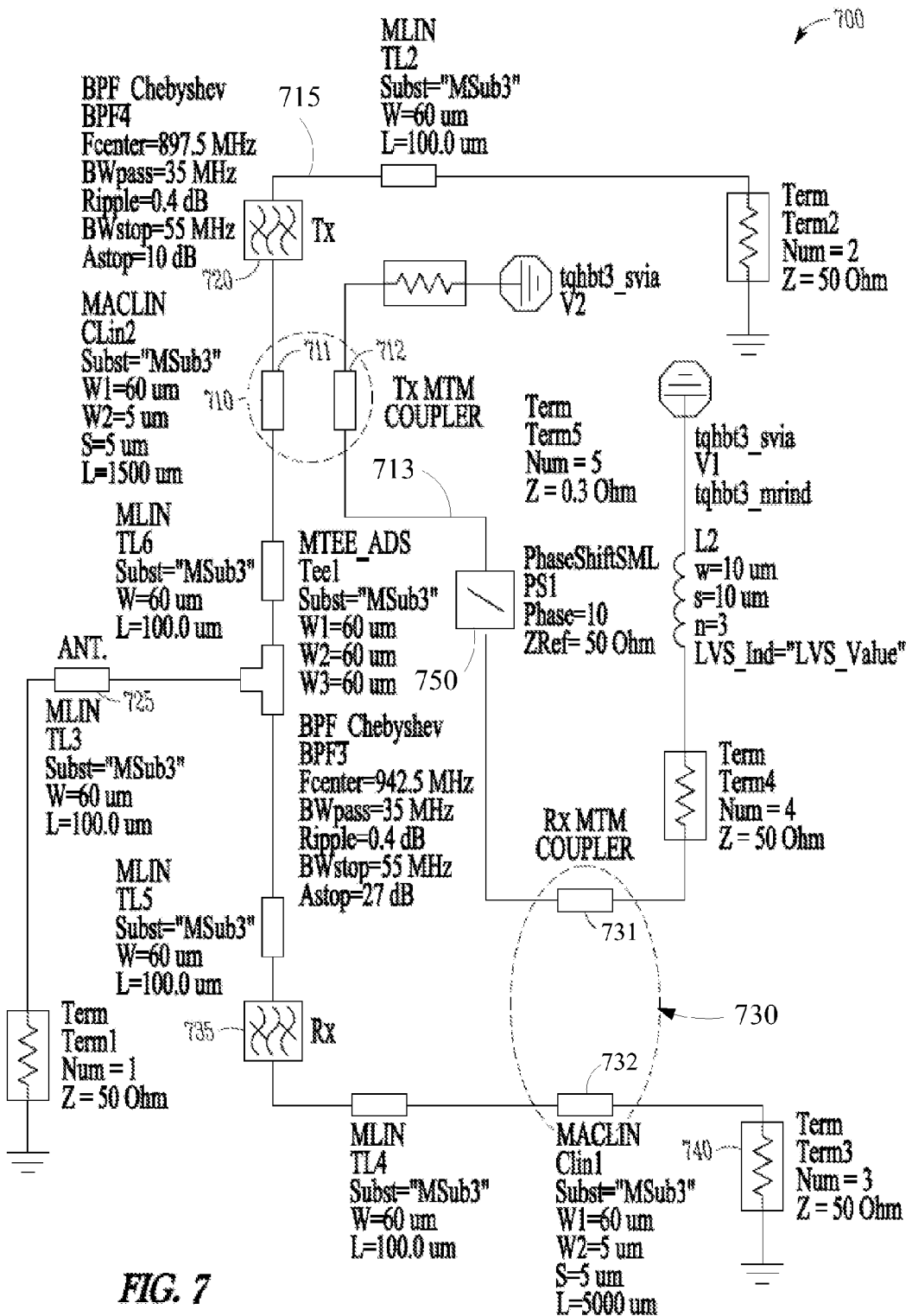
FIG. 7 illustrates generally a block schematic diagram illustrating a duplexer with tapping devices for a feedback path according to an example.

FIG. 7 illustrates generally a block schematic diagram illustrating a system 700 with tapping devices 2 and 2' as shown in FIG. 5. The tapping device 2 is represented as a transmit coupling device 710 having a through line portion 711 on the Tx path 715 between the Tx BPF 720 and the antenna 725 and further having a coupling line portion 712 on the coupling line 713 The tapping device 2' is represented as a receive coupling device 730 having a through line portion 731 that is coupled between the Rx BPF 735 and a receive port 740. A phase shifter 750 is coupled in a feed forward path, on the coupling line 713, between the transmit coupling device 710 and receive coupling device 730 to provide the approximately 180 degree phase difference between a leakage path and the coupling path, wherein a leakage path refers to a path for Tx signals to travel to the receive circuitry. The gain of the coupling path can be controlled by selection of component dimensions in the couplers, for example transmission line lengths and/or the gap between through line portions 711, 731 and coupling line portions 712, 732, respectively, which affect the effectiveness of the coupling. The through line refers to the duplexer circuitry for processing transmit and receive signals. The coupling line refers to the additional transmission line added to provide the couplers applied in the various embodiments described herein.

Figure 8:
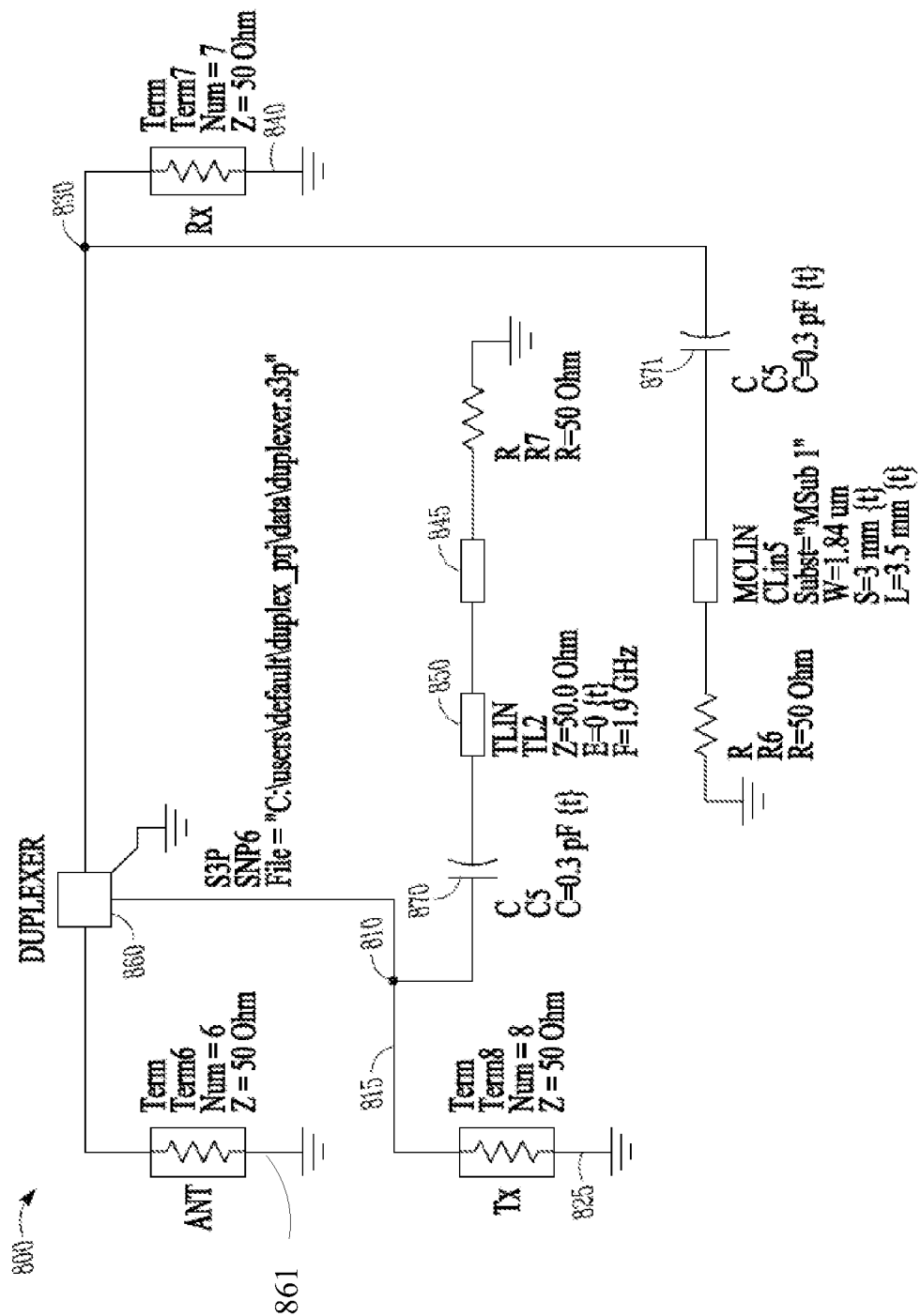
FIG. 8 illustrates generally a block schematic diagram illustrating a duplexer with alternative tapping devices according to an example.

FIG. 8 illustrates generally a block schematic diagram illustrating a system 800 with tapping devices 1a and 1'a as shown in FIG. 5. Signals in the Tx frequency band can travel from Tx port 825 to Rx port 840 through two paths. One path is to go through duplexer 860 and the other path is to go through 1a-1'a path. The 1a-1'a path will provide an out-of-phase signal with similar magnitude as to signals traveling on the path through the duplexer 860 in Tx frequency band.

The isolation between Tx port 825 and Rx port 840 can be improved. The 1a-1'a path is established by tapping two ends of the 1a-1'a path, points 810 and 830 respectively, wherein point 810 is between the duplexer 860 and the Tx port 825 and point 830 is between the duplexer 860 and Rx port 840. The 1a-1'a path comprises one directional coupler, two coupling capacitors (C5 and C6) and a transmission line 850. Two coupling capacitors 870, 871 and the directional coupler 845 control the coupling magnitude in 1a-1'a path. The length of transmission line 850 and directional coupler 845 control the phase in 1a-1'a path to approximately 180 degrees between the two paths at point 830. The non-connected ends of the directional coupler 845 are terminated with resistors, such as 50 Ohm resistors.

The Tx/Rx isolation shown in the FIG. 8 indicates an improvement in a small band at transmit band. A measured performance of one implementation of the embodiment FIG. 8 illustrates that the Rx in-band and Tx in-band insertion losses from Tx port 825 to antenna 861 and from Rx port 840 to antenna 861 are similar with or without the coupling path 1a-1'a, while the isolation between Tx port 825 and Rx port 840 in the Tx frequency band can result in more than a 15 dB improvement.

Figure 9:
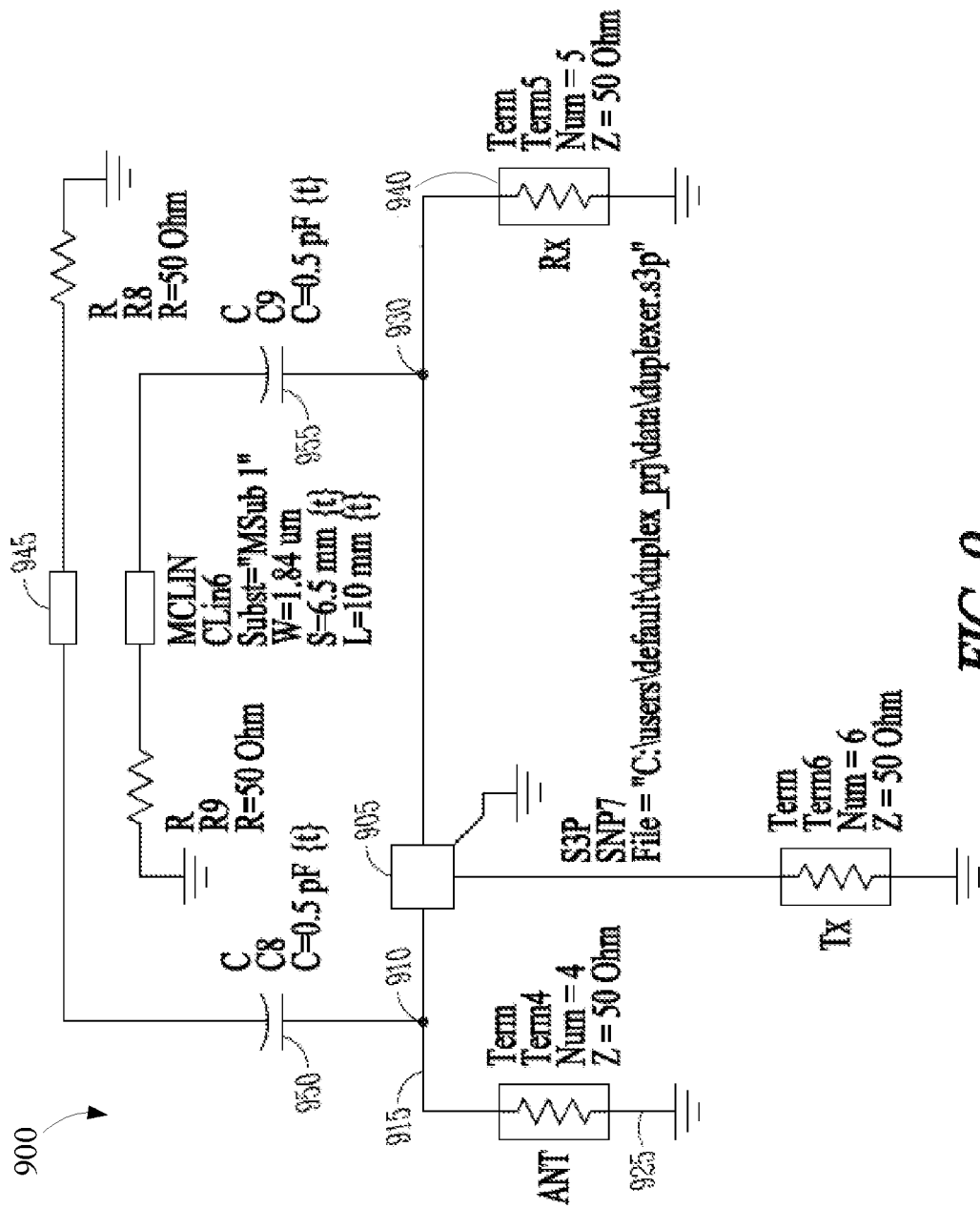
FIG. 9 illustrates generally a block schematic diagram illustrating a duplexer with alternative external tapping devices according to an example.

FIG. 9 illustrates generally a block schematic diagram illustrating a system 900 with an alternative feedback path utilizing tapping devices positioned external to the duplexer 905. A transmit tapping device is represented by the direct electrical connection 910 to Tx path 915 between the duplexer 905 and antenna 925. A receive tapping device is represented by the direct electrical connection 930 to the Rx path between duplexer 905 and receive port 940. The tapping devices are coupled to each other as indicated at coupler 945. Phase control is performed via coupler 945. The gain of the feed forward path can be controlled by selection of component values of capacitors 950 and 955 in the feedback path as well as the efficiency of the coupler 945.

Figure 10:
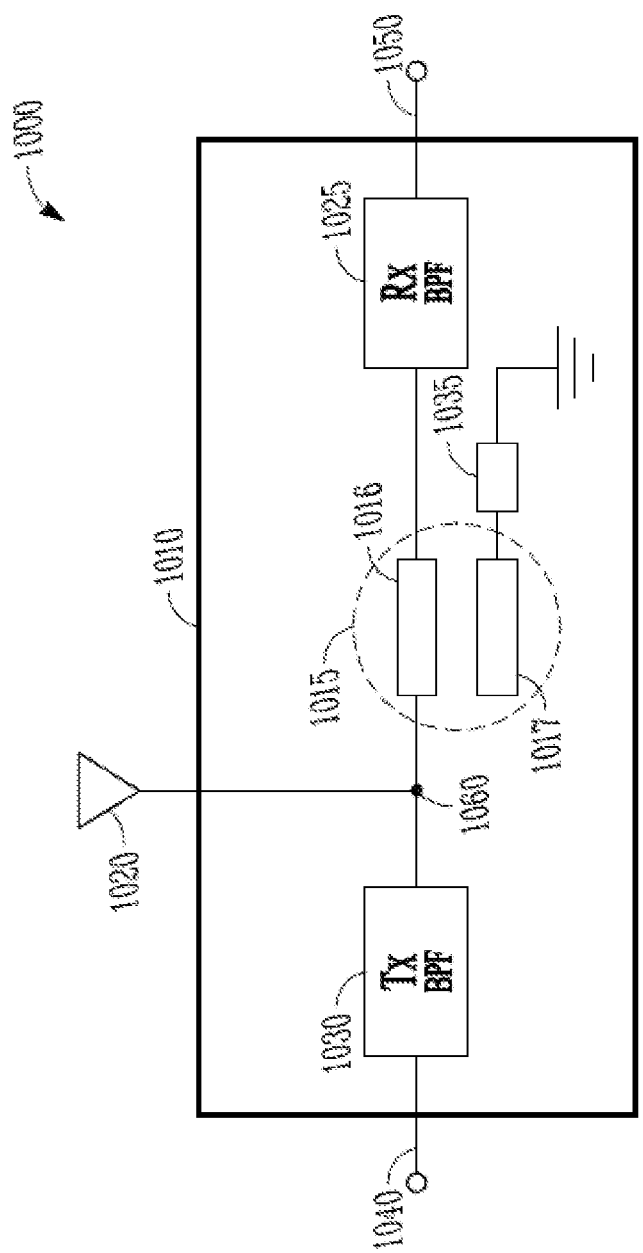
FIG. 10 illustrates generally a block diagram of a duplexer having a coupling device to suppress Tx leakage according to an example.

FIG. 10 illustrates generally a block diagram of a system 1000 including a duplexer 1010 having a coupling device, or coupler, 1015 to suppress Tx leakage. In an embodiment, the coupler 1015 replaces a quarter wavelength transformer to provide a higher reflection coefficient for better rejection of signals in the Tx frequency band, while signals in the Rx frequency band are much less affected, seeing an impedance of approximately 50 Ohms in an embodiment. The coupling device 1015 is positioned between the node 1060 and a Rx BPF 1025. The antenna port 1020 is also coupled to a transmit band pass filter 1030 via the node 1060. The coupling device 1015 in an embodiment positions a coupling structure through transmission line 1016, referred to as the through line portion, and couples another coupling structure to transmission line 1017, referred to as the coupling line portion. The coupled transmission line is terminated by an open to the node 1060 side and includes a grounded transmission line to the input side of Rx BPF 1025. The through transmission line interconnects the node 1060 and Rx BPF 1025. The coupling line portion 1016 coupled to the Rx path and having a coupled transmission line with termination of an open and a short as before-mentioned has a fine phase adjustment element 1035 to provide a further improvement for highest reflection coefficient to signals in the transmit band at the node 1060 and hence provide an improved isolation (suppression of Tx leakage) between Tx port 1040 and Rx Port 1050. The duplexer 1010 is further coupled to the antenna 1020, having a transmit path from the Tx port 1040 and including the Tx BPF 1030, and also having a receive path wherein the coupling structure is provided between the antenna and the Rx BPF 1025 leading to the Rx port 1050.

FIGS. 11A and 11B include illustrative examples of coupler 1015 performance as in FIG. 10 for transmit and receive frequency bands respectively. The coupler 1015 in FIG. 11A includes the through line portion 1016 and the coupling line portion 1017, which together make up the coupler 1015. The coupler 1015 provides a way to change the reflection coefficient of the Rx Part of the duplexer 1100 for different operation. For frequencies in the Rx frequency band, the reflection coefficient is reduced so as to pass signals of these frequencies, while for the Tx frequency band the reflection coefficient is increased to reject such signals. The reflection coefficient is considered at the node 1060 and at an input to the Rx BPF 1025. The coupler 1015 acts to transfer the reflection coefficient, $\Gamma$, for a better rejection (e.g., toward an open circuit equivalent), when rejecting transmit signals. The coupler 1015 in one example transfers $\Gamma$ from $\Gamma_b \sim 0.85$ at the input to the Rx BPF 1025 to $\Gamma_a \sim 0.95$ at the node 1060.

FIG. 11A illustrates operation of the Rx Part of the duplexer 1100 with coupler 1015 in processing Tx frequency band signals; and FIG. 11B illustrates operation processing Rx frequency band signals. In the embodiment of FIGS. 11A and 11B, the through line portion 1016 can be considered or modeled as having parameters of line length L1 and its characteristic impedance Z0, while coupling line portion 1017 can be considered or modeled as having parameters of line length L2 and its characteristic impedance Z1. As illustrated, in the scenario of FIG. 11A the Rx BPF 1025 is considered or modeled as exhibiting an input impedance of approximately 1-4 Ohm resistance. As illustrated, in the scenario of FIG. 11B the Rx BPF 1025 is considered or modeled as exhibiting an input impedance of approximately 50 Ohm resistance. In both scenarios the fine phase adjustment element 1035 is considered or modeled as having parameters of line length L3 and its characteristic impedance Z1.

The coupler 1015 as illustrated in FIG. 11B is designed to have a reduced reflection coefficient when Rx frequency band signals are processed, and thus pass such signals through to the Rx BPF 1025. In this scenario operation of the duplexer 2010 with coupler 2015 has a rejection coefficient of $\Gamma_b \sim 0.2$ at the input to the Rx BPF 1025 and of $\Gamma_a \sim 0.3$ at the Tx port 1040. In this way, the coupler 1015 provides the desired input impedance for each frequency band. In various embodiments, such input impedance adjustment and specification is used to prevent overload or saturation of receive circuitry and modules, including, as illustrated in FIG. 1, the LNA 140 and demodulator 152 in the RFIC 151 that can cause a receiver desensitization of a device 150.

Figure 12:
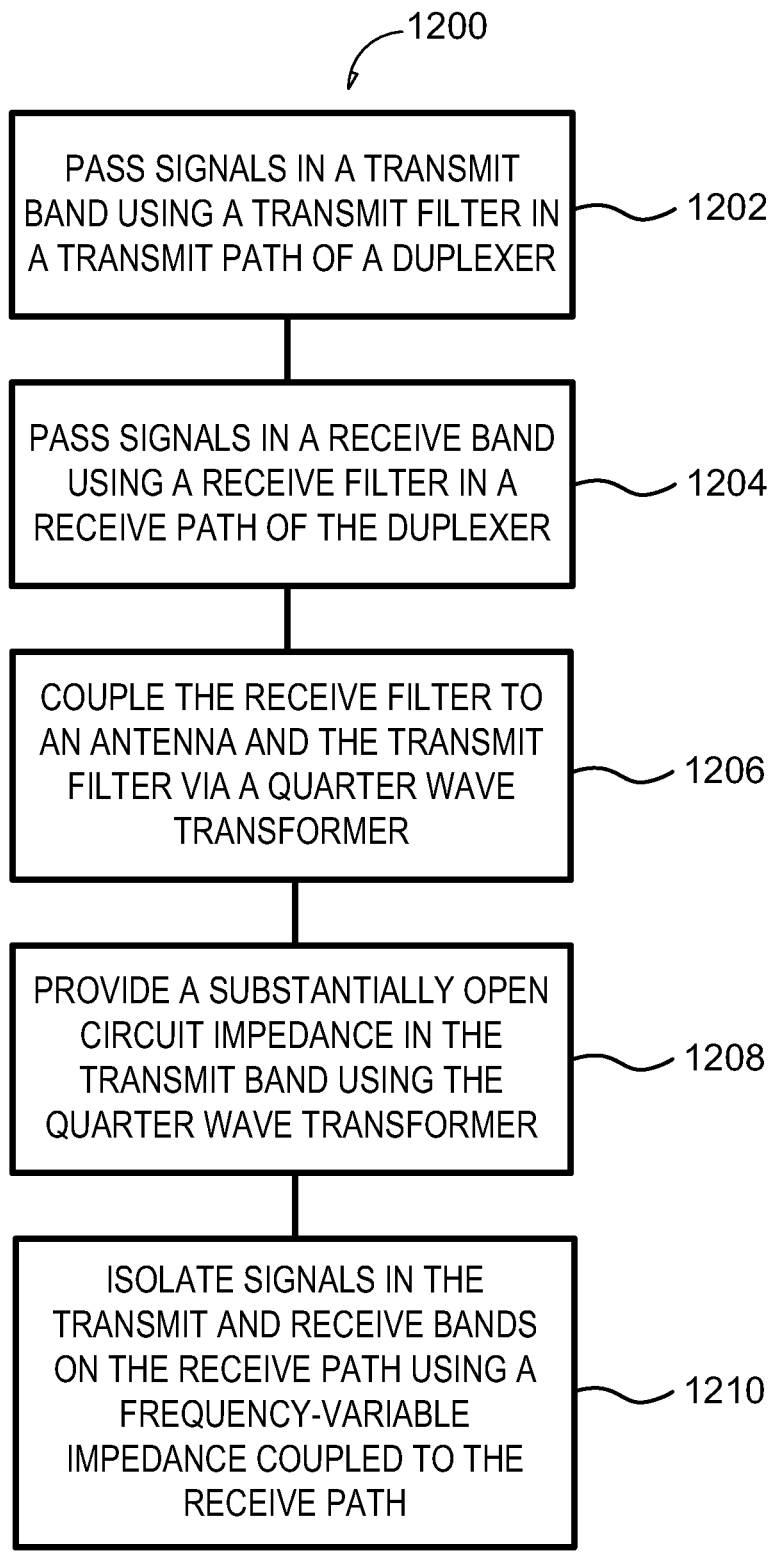
FIG. 12 illustrates generally a technique, such as a method, that can include isolating signals in the receive path, such as using a frequency-variable impedance coupled to the receive path.

FIG. 12 illustrates generally a technique 1200, such as a method, that can include, at 1202, passing signals in a transmit band using a transmit filter in a transmit path of a duplexer, such as according to one or more of the embodiments discussed above. At 1204, the technique 1200 can include passing signals in a receive band using a receive filter in a receive path of the duplexer. At 1206, the technique can include coupling the receive filter to an antenna and the transmit filter, such as a via a quarter wave transformer. At 1208, a substantially open-circuit impedance can be provided in the range of frequencies of the transmit band, using the quarter wave transformer. At 1210, signals in the transmit and receive bands can be isolated in the receive path, such as using a frequency-variable impedance coupled to the receive path. In this manner, transmit band signals in the receive path can be attenuated or otherwise rejected, such as to prevent desensitization or saturation of a receiver circuit located in the receive path.

Various Notes and Examples

Example 1 includes subject matter (such as an apparatus or system) comprising a transmit filter in a transmit path of a duplexer configured to be coupled to an antenna, the transmit filter configured to pass signals in a transmit band, a receive filter in a receive path of the duplexer, the receive filter configured to be coupled to the antenna and to the transmit filter, and configured to pass signals in a receive band different from the transmit band, a quarter wave transformer tuned to a substantially open circuit impedance in the transmit band, the quarter wave transformer configured to couple the receive filter to the antenna and transmit filter, and a frequency-variable impedance coupled to the receive path to provide isolation between signals in the transmit and receive bands on the receive path.

In Example 2, the subject matter of Example 1 can optionally include a frequency-variable impedance comprising a notch filter tuned to attenuate signals in the transmit band.

In Example 3, the subject matter of one or any combination of Examples 1-2 can optionally include a notch filter coupled to an output of the receive filter.

In Example 4, the subject matter of one or any combination of Examples 1-3 can optionally include a power amplifier coupled to the transmit path, and a low noise amplifier coupled to the receive path.

In Example 5, the subject matter of one or any combination of Examples 1-4 can optionally include an RF device coupled to the low noise amplifier and the power amplifier.

In Example 6, the subject matter of one or any combination of Examples 1-5 can optionally include a frequency-variable impedance comprising a coupler configured to present a substantially open circuit impedance to signals in the transmit band.

In Example 7, the subject matter of one or any combination of Examples 1-6 can optionally include a coupler comprising a grounded transmission line coupled to the receive path and having a specified impedance configured to provide a higher reflection coefficient to signals in the transmit band than signals in the receive band.

In Example 8, the subject matter of one or any combination of Examples 1-7 can optionally include a coupler configured to transfer a reflection coefficient from $\Gamma_b \sim 0.85$ to $\Gamma_a \sim 0.95$ to reject signals in the transmit band without affecting the reflection coefficient of $\Gamma_b \sim 0.2$ to $\Gamma_a \sim 0.3$ when receive signals within the receive band are passed.

In Example 9, the subject matter of one or any combination of Examples 1-8 can optionally include a coupler comprising a metamaterial structure.

In Example 10, the subject matter of one or any combination of Examples 1-9 can optionally include a coupler comprising a pair of couplers forming a phase shift path, the couplers respectively tapped into the transmit path and the receive path, and the couplers configured to provide an approximately same magnitude but 180 degree phase difference between the transmit signals occurring in the leakage path as compared to transmit signals provided by the coupling path.

In Example 11, the subject matter of one or any combination of Examples 1-10 can optionally include transmit and receive filters comprising bandpass filters.

In Example 12, the subject matter of one or any combination of Examples 1-11 can optionally include one or more of the transmit filter or the receive filter comprising a SAW filter or a BAW filter.

Example 13 can include, or can optionally be combined with the subject matter of one or any combination of Examples 1-12 to include, subject matter (such as a method, a means for performing acts, or a machine-readable medium including instructions that, when performed by the machine, cause the machine to perform acts) comprising passing signals in a transmit band using a transmit filter in a transmit path of a duplexer, passing signals in a receive band using a receive filter in a receive path of the duplexer, coupling the receive filter to an antenna and the transmit filter via a quarter wave transformer, providing a substantially open circuit impedance in the transmit band using the quarter wave transformer, and isolating signals in the transmit and receive bands on the receive path using a frequency-variable impedance coupled to the receive path.

In Example 14, the subject matter if Example 13 can optionally include isolating the signals including attenuating signals in the transmit band using a notch filter.

In Example 15, the subject matter of one or any combination of Examples 13-14 can optionally include isolating the signals including providing a higher reflection coefficient to signals in the transmit band than signals in the receive band using a coupler including a grounded transmission line.

In Example 16, the subject matter of one or any combination of Examples 13-15 can optionally include isolating the signals including providing a higher reflection coefficient to signals in the transmit band than signals in the receive band using a coupler comprising a metamaterial.

In Example 17, the subject matter of one or any combination of Examples 13-16 can optionally include isolating the signals including using a pair of couplers forming a phase shift path, the couplers respectively tapped into the transmit path and the receive path, and the couplers configured to provide an approximately same magnitude but 180 degree phase difference between the transmit signals occurring in the leakage path as compared to transmit signals provided by the coupling path.

In Example 18, the subject matter of one or any combination of Examples 13-17 can optionally include one or more of the transmit filter or the receive filter comprising a SAW filter or a BAW filter.

Example 19 can include, or can optionally be combined with the subject matter of one or any combination of Examples 1-18 to include, subject matter (such as an apparatus or system) comprising a transmit filter in a transmit path of a duplexer, the transmit filter configured to be coupled to an antenna, and configured pass signals in a transmit band, a receive filter in a receive path of the duplexer, the receive filter configured to be coupled to the antenna and to the transmit filter to pass signals in a receive band different from the transmit band, a quarter wave transformer coupled between the transmit filter and the receive filter in the receive path, wherein the quarter wave transformer is configured to provide a substantially open circuit impedance in the transmit band, a pair of couplers forming a phase shift path, the couplers respectively tapped into the transmit path and the receive path, and the couplers configured to provide an approximately same magnitude but 180 degree phase difference.

In Example 20, the subject matter of Example 19 can optionally include at least one coupler comprising a metamaterial.

In Example 21, the subject matter of one or any combination of Examples 19-20 can optionally include magnitude and phase measured at the respective couplers.

In Example 22, the subject matter of one or any combination of Examples 19-21 can optionally include a coupling path comprising a phase adjuster.

In Example 23, the subject matter of one or any combination of Examples 19-22 can optionally include transmit and receive filters comprising band pass filters.

In Example 24, the subject matter of one or any combination of Examples 19-23 can optionally include one or more of the transmit filter or the receive filter comprising a SAW filter or a BAW filter.

Example 25 can include, or can optionally be combined with the subject matter of one or any combination of Examples 1-18 to include, subject matter (such as an apparatus or system) comprising a transmit filter to couple to an antenna node and pass signals in a transmit band, a receive filter to couple to the antenna node and to the transmit filter to pass signals in a receive band different from the transmit band, and a coupler positioned between the antenna node and the receive filter, to change impedance between the transmit and receive bands.

In Example 26, the subject matter of Example 25 can optionally include a coupler coupled between the receive filter and a port to couple an antenna to the receive filter and the transmit filter.

In Example 27, the subject matter of one or any combination of Examples 25-26 can optionally include a coupler configured to operate as a 50 Ohm line to signals in the receive band when the input impedance of the receive band pass filter is close to 50 Ohm and configured to operate as an open to signals in the transmit band when the input impedance of the receive band pass filter is far from 50 Ohm.

In Example 28, the subject matter of one or any combination of Examples 25-27 can optionally include a coupler comprising a grounded transmission line in a transmission path between the port to couple an antenna and the receive filter.

In Example 29, the subject matter of one or any combination of Examples 25-28 can optionally include a coupler comprising a further transmission line electromagnetically coupled to the transmission line.

In Example 30, the subject matter of one or any combination of Examples 25-29 can optionally include a first end of the further transmission line configured as an open-circuit, and a second end of the further transmission line coupled to a system ground.

In Example 31, the subject matter of one or any combination of Examples 25-30 can optionally include a coupler comprising a phase adjusting transmission line coupled between the further transmission line and system ground.

In Example 32, the subject matter of one or any combination of Examples 25-31 can optionally include a coupler configured to provide a reflection coefficient for the transmit band that is higher than a reflection coefficient for the receive band.

In Example 33, the subject matter of one or any combination of Examples 25-32 can optionally include a reflection coefficient of the coupler for the transmit band of at least approximately 0.95.

In Example 34, the subject matter of one or any combination of Examples 25-33 can optionally include a reflection coefficient of the coupler for the receive band of less than approximately 0.3.

Example 35 can include, or can optionally be combined with any portion or combination of any portions of any one or more of Examples 1-34 to include, subject matter that can include means for performing any one or more of the functions of Examples 1-34, or a machine-readable medium including instructions that, when performed by a machine, cause the machine to perform any one or more of the functions of Examples 1-34.

These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A system comprising:
a transmit filter in a transmit path of a duplexer configured to be coupled to an antenna, the transmit filter configured to pass signals in a transmit band;
a receive filter in a receive path of the duplexer, the receive filter configured to be coupled to the antenna and to the transmit filter, and configured to pass signals in a receive band different from the transmit band;
a quarter wave transformer tuned to a substantially open circuit impedance in the transmit band, the quarter wave transformer configured to couple the receive filter to the antenna and transmit filter;
a frequency-variable impedance coupled to the receive path to provide isolation between signals in the transmit and receive bands on the receive path by attenuating signals in the transmit band; and a pair of couplers forming a phase shift path, wherein
the pair of couplers is respectively tapped into the transmit path and the receive path outside the duplexer between the transmit path and a power amplifier of the system along the transmit path, and between the receive path and a low noise amplifier along the receive path, and
wherein each coupler of the pair of couplers is coupled to the other coupler of the pair, the pair of couplers to provide a corresponding magnitude control to effectively cancel signals leaking from the transmit path into the receive path at substantially the point at which the pair is tapped into the transmit path and the receive path.

2. The system of claim 1, wherein the frequency-variable impedance is a notch filter.

3. The system of claim 1, comprising:
a power amplifier coupled to the transmit path; and
a low noise amplifier coupled to the receive path.

4. The system of claim 3, comprising an RF device coupled to the low noise amplifier and the power amplifier.

5. The system of claim 1, wherein the frequency-variable impedance comprises a coupler configured to present a substantially open circuit impedance to signals in the transmit band.

6. The system of claim 5, wherein the coupler comprises a grounded transmission line coupled to the receive path and having a specified impedance configured to provide a higher reflection coefficient to signals in the transmit band than signals in the receive band.

7. The system of claim 6, wherein the coupler is configured to transfer a reflection coefficient from $\Gamma_b$, ~0.85 to $T_a$~0.95 to reject signals in the transmit band without affecting the reflection coefficient of $\Gamma_b$~0.2 to $T_a$~0.3 when receive signals within the receive band are passed.

8. The system of claim 6, wherein the coupler comprises a metamaterial structure.

9. The system of claim 6, wherein the coupler comprises a pair of couplers forming a phase shift path, the couplers respectively tapped into the transmit path and the receive path, and the couplers configured to provide an approximately same magnitude but 180 degree phase difference between the transmit signals occurring in the leakage path as compared to transmit signals provided by the coupling path.

10. The system of claim 1, wherein the transmit and receive filters comprise bandpass filters.

11. The system of claim 1, wherein one or more of the transmit filter or the receive filter includes a SAW filter or a BAW filter.

12. A method, comprising:
passing signals in a transmit band using a transmit filter in a transmit path of a duplexer;
passing signals in a receive band using a receive filter in a receive path of a duplexer;
coupling the receive filter to an antenna and the transmit filter via a quarter wave transformer;
providing a substantially open circuit impedance in the transmit band using the quarter wave transformer; and
isolating signals in the transmit and receive bands on the receive path using a frequency-variable impedance coupled to the receive path to attenuate signals in the transmit band by
forming a phase shift path with a pair of couplers, wherein
the pair of couplers is respectively tapped into the transmit path and the receive path outside the duplexer between the transmit path and a power amplifier of the system along the transmit path, and between the receive path and a low noise amplifier along the receive path, and
wherein each coupler of the pair of couplers is coupled to the other coupler of the pair, the pair of couplers to provide a corresponding magnitude control to effectively cancel signals leaking from the transmit path into the receive path at substantially the point at which the pair is tapped into the transmit path and the receive path.

13. The method of claim 12, wherein the isolating the signals includes attenuating signals in the transmit band using a notch filter.

14. The method of claim 12, wherein the isolating the signals includes providing a higher reflection coefficient to signals in the transmit band than signals in the receive band using a coupler including a grounded transmission line.

15. The method of claim 12, wherein the isolating the signals includes providing a higher reflection coefficient to signals in the transmit band than signals in the receive band using a coupler comprising a metamaterial structure.

16. The method of claim 12, wherein the isolating the signals includes using a pair of couplers forming a phase shift path, the couplers respectively tapped into the transmit path and the receive path, and the couplers configured to provide an approximately same magnitude but 180 degree phase difference between the transmit signals occurring in the leakage path as compared to transmit signals provided by the coupling path.

17. The method of claim 12, wherein one or more of the transmit filter or the receive filter includes a SAW filter or a BAW filter.

18. A system comprising:
a transmit filter in a transmit path of a duplexer, the transmit filter configured to be coupled to an antenna, and configured pass signals in a transmit band;
a receive filter in a receive path of the duplexer, the receive filter configured to be coupled to the antenna and to the transmit filter to pass signals in a receive band different from the transmit band;
a quarter wave transformer coupled between the transmit filter and the receive filter in the receive path, wherein the quarter wave transformer is configured to provide a substantially open circuit impedance in the transmit band; and
a plurality of pairs of couplers, each of the plurality of pairs of couplers forming a phase shift path, each respective pair of couplers of the plurality of pairs of couplers tapped into the transmit path and the receive path at a different point, the respective pairs of couplers configured to provide an approximately same magnitude but 180 degree phase difference, each coupler of each respective pair of couplers coupled to the other coupler of the pair, each respective pair of couplers to provide a corresponding magnitude control to effectively cancel signals leaking from the transmit path into the receive path at substantially the point at which each respective pair is tapped into the transmit path and the receive path.

19. The system of claim 18, wherein at least one coupler comprises a Metamaterial structure.

* * * * *